US008284612B2

(12) United States Patent
Yoshihara et al.

(10) Patent No.: US 8,284,612 B2
(45) Date of Patent: Oct. 9, 2012

(54) SEMICONDUCTOR MEMORY DEVICE

(75) Inventors: Masahiro Yoshihara, Yokohama (JP);
Teruo Takagiwa, Yokohama (JP);
Katsumi Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 12/884,721

(22) Filed: Sep. 17, 2010

(65) Prior Publication Data
US 2011/0205806 A1   Aug. 25, 2011

(30) Foreign Application Priority Data

Feb. 19, 2010   (JP) ................................ 2010-035027

(51) Int. Cl.
*G11C 16/06* (2006.01)
(52) U.S. Cl. .......... 365/185.22; 365/185.17; 365/189.05
(58) Field of Classification Search ............. 365/185.22, 365/185.17, 189.05
See application file for complete search history.

(56) References Cited

U.S. PATENT DOCUMENTS

| 5,535,170 | A * | 7/1996 | Imamura et al. ............... 365/239 |
| 6,657,891 | B1 | 12/2003 | Shibata et al. |
| 7,952,958 | B2 * | 5/2011 | Yanagidaira et al. .... 365/233.19 |
| 2002/0051385 | A1 * | 5/2002 | Hosono et al. ........... 365/185.22 |
| 2005/0286308 | A1 * | 12/2005 | Nagashima ............... 365/185.22 |
| 2007/0030739 | A1 * | 2/2007 | Hartono et al. .......... 365/189.07 |
| 2010/0034025 | A1 * | 2/2010 | Yanagidaira et al. .... 365/185.18 |
| 2012/0072806 | A1 * | 3/2012 | Tabata et al. ................. 714/773 |

FOREIGN PATENT DOCUMENTS
JP           3935139           3/2007

OTHER PUBLICATIONS

U.S. Appl. No. 13/151,548, filed Jun. 2, 2011, Komai.

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

According to one embodiment, a semiconductor memory device includes memory cells, holding circuits, and a logical gate chain. The memory cells are associated with columns. The holding circuits are associated with the columns and capable of holding first information indicating whether associated one of the columns is a verify-failed column or not. The logical gate chain includes a plurality of first logical gates associated with the columns and connected in series. Each of the first logical gates outputs a logical level to a next-stage first logical gate in a series connection. The logical level indicates whether the verify-failed column exists or not based on the first information in associated one of the holding circuit. The content indicated by the logical level output from each of the first logical gates is inverted using one of the first logical gates associated with the verify-failed column as a border.

17 Claims, 12 Drawing Sheets

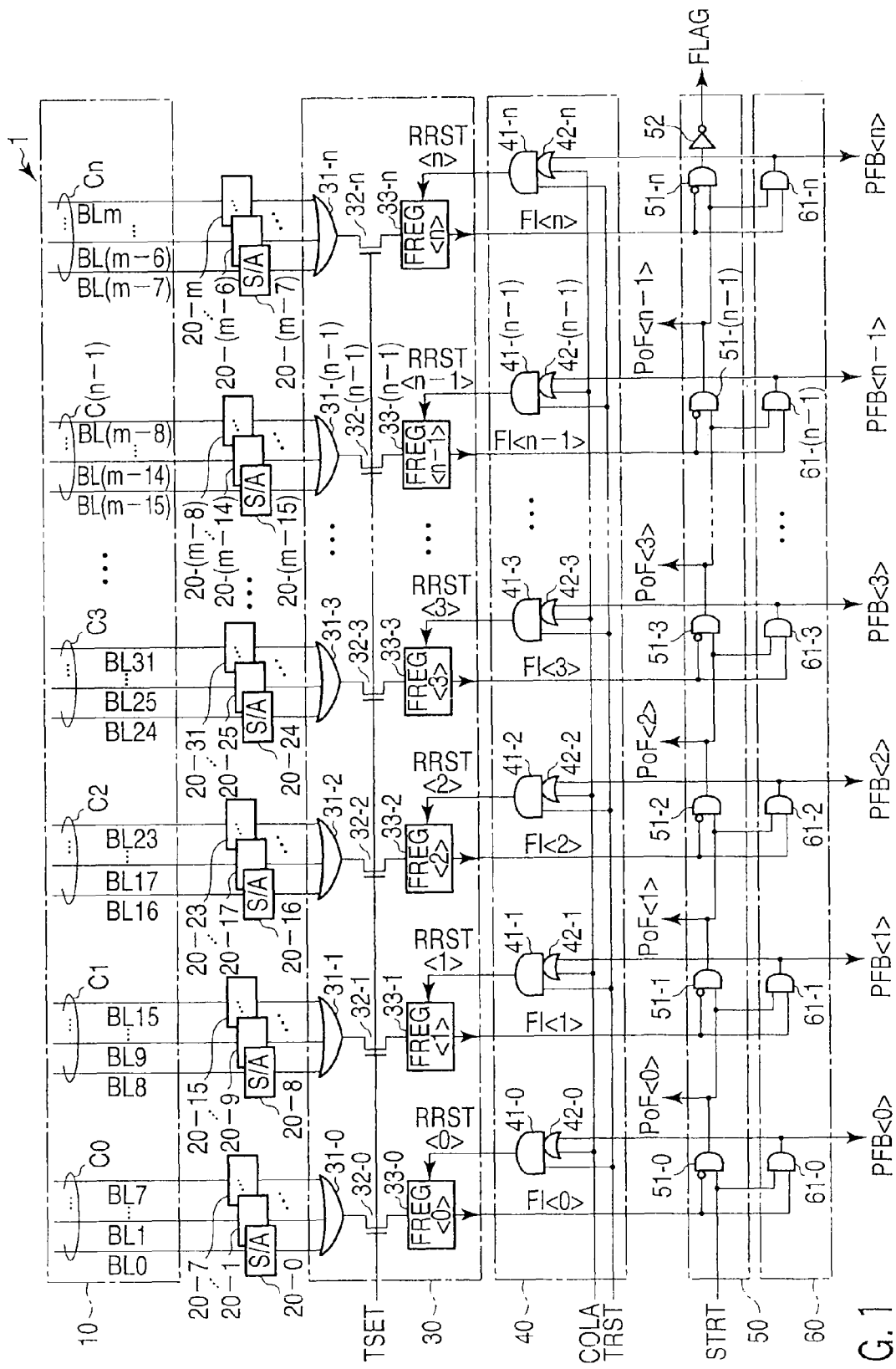
F I G. 1

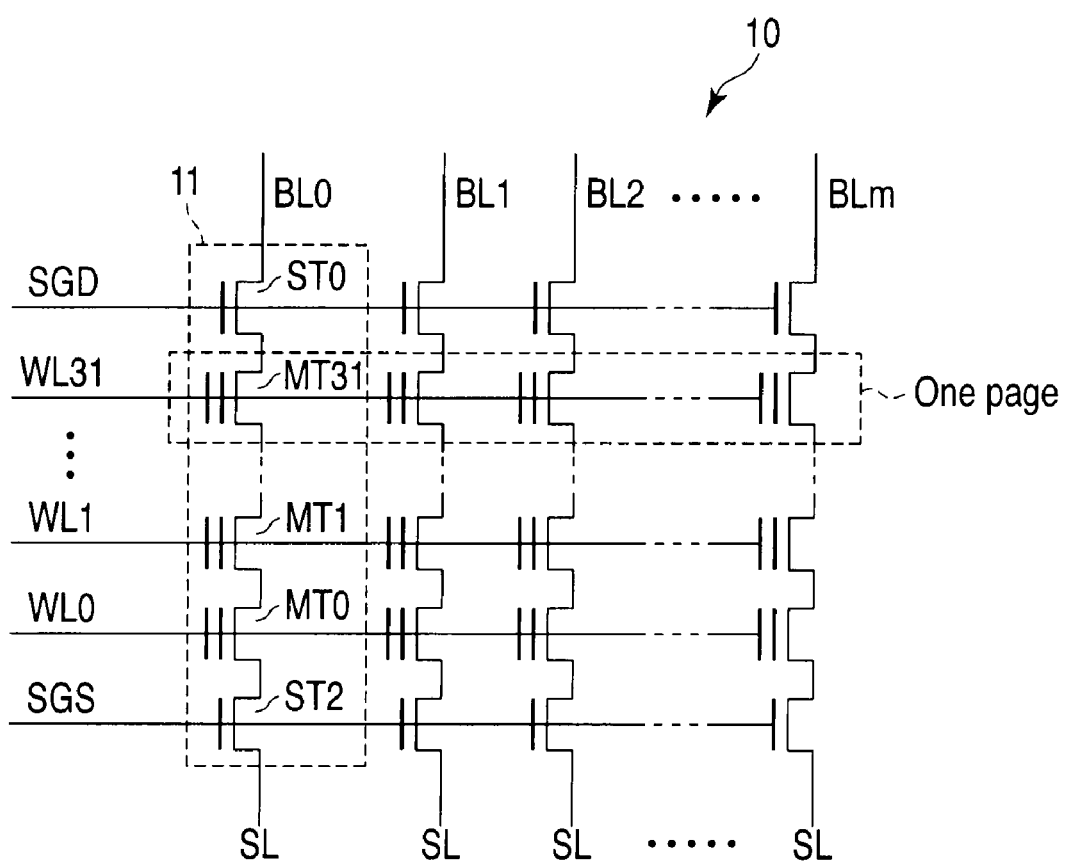
F I G. 2

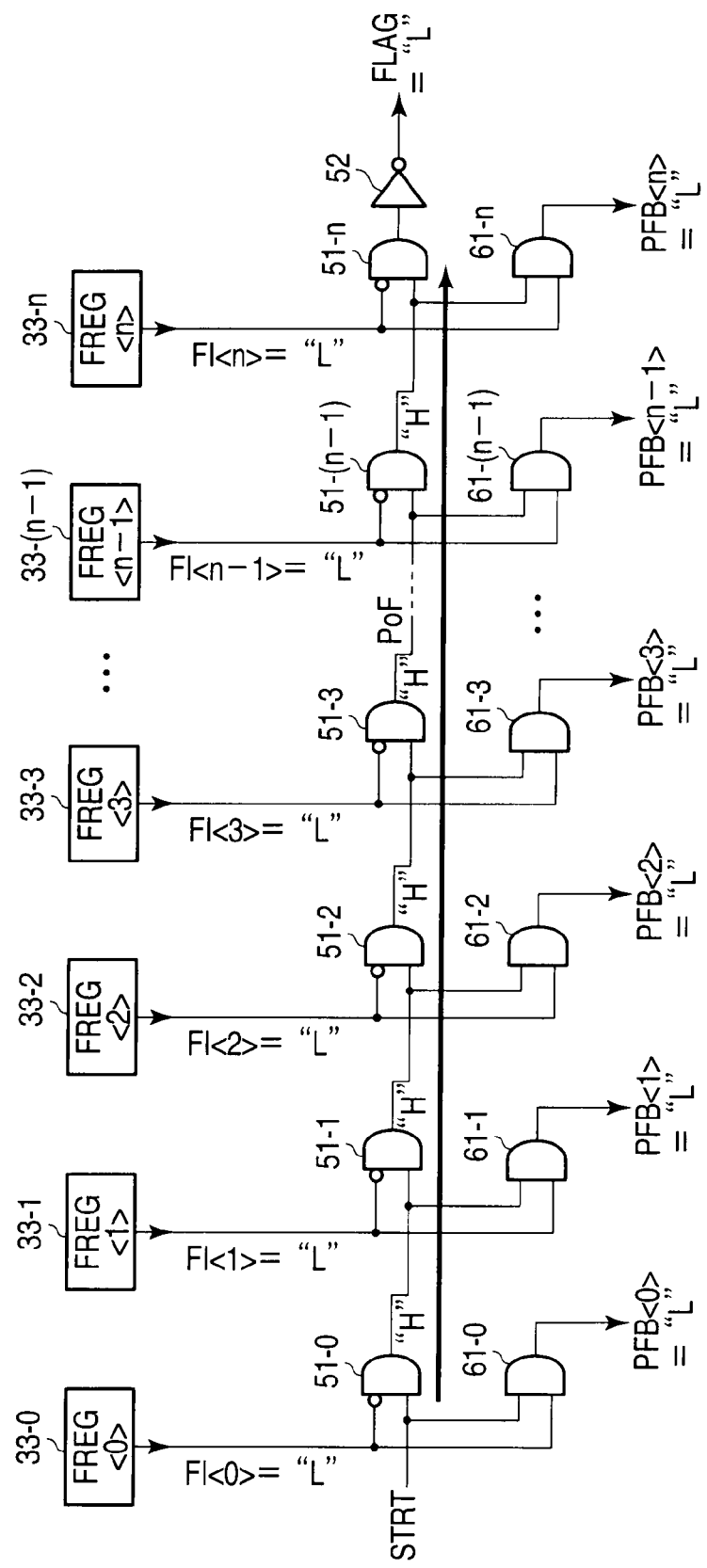
F I G. 5

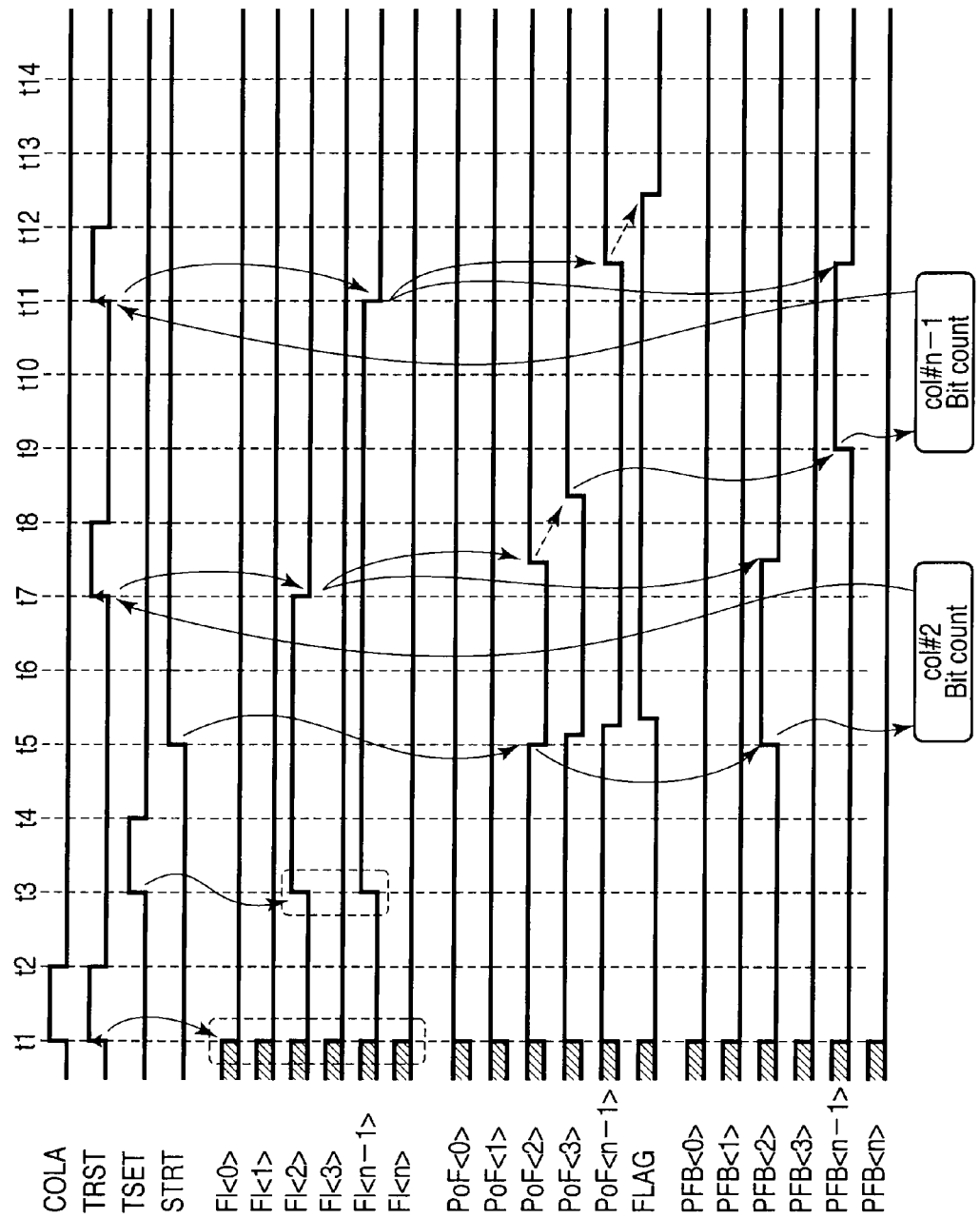
F I G. 8

SEMICONDUCTOR MEMORY DEVICE

CROSS-REFERENCE TO RELATED APPLICATIONS

This application is based upon and claims the benefit of priority from Japanese Patent Application No. 2010-035027, filed Feb. 19, 2010; the entire contents of which are incorporated herein by reference.

FIELD

Embodiments described herein relate generally to a semiconductor memory device, for example, to a method of determining a verification result in a semiconductor memory.

BACKGROUND

In a conventional NAND flash memory, a verification operation is carried out when data is written. This technique is disclosed in Japanese Patent No. 3935139, for example. In this case, the following function (hereinafter, referred to as a pseudo-pass function) has been known. According to the function, if a bit error is less than a predetermined number in the verification result, the bit error is allowed and a program sequence is completed. The foregoing function is used, and thereby, a data write speed is improved.

In order to use the function, a circuit technique of counting the number of bit errors is required. Conventionally, this circuit technique is realized by employing a binary search to specify a failed column (column including the bit error).

However, when the foregoing binary search is employed, time is taken to specify a failed column, and a NAND flash memory must be configured to have a mass capacity; as a result, a data write speed is lowered.

Moreover, according to the column specification using the binary search, a column address is activated by the half from a state of being all selected, and further, the remaining half is activated, . . . to specify a failed column. Then, a failed column must be searched every activation. For this reason, a column address circuit is occupied for a period of specifying a failed column. As a result, it is impossible to accept an address input externally for the foregoing period. In order to accept the address input, the following operation is required. Namely, a failed column search is interrupted, and after address input, the failed column search must be retried from the beginning.

BRIEF DESCRIPTION OF THE DRAWINGS

FIG. 1 is a block diagram showing the configuration of a flash memory according to a first embodiment;

FIG. 2 is a circuit diagram showing the configuration of a memory cell array according to a first embodiment;

FIGS. 5, 6, and 7 are block diagrams showing the configuration of a flash memory according to a first embodiment;

FIG. 8 is a timing chart showing various signals according to a first embodiment.

DETAILED DESCRIPTION

Figure 3:
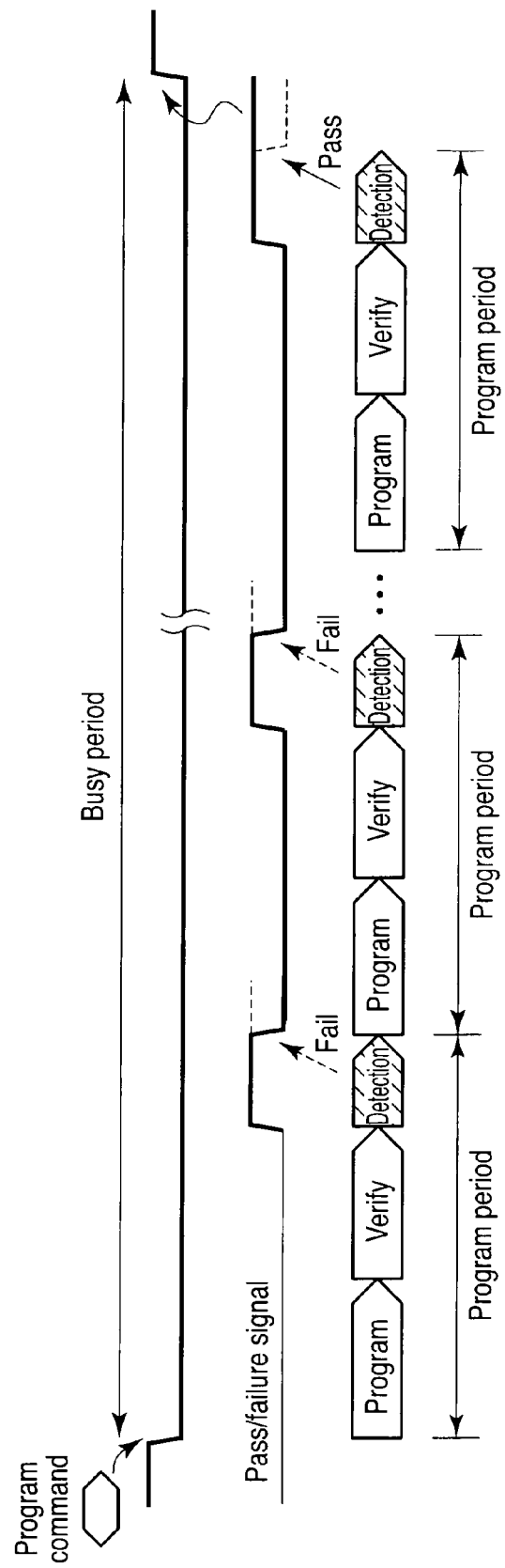
FIG. 3 is a timing chart showing a write operation according to a first embodiment.

In general, according to one embodiment, a semiconductor memory device includes: a plurality of memory cells; a plurality of holding circuits; and a logical gate chain. The memory cells are associated with columns and capable of holding data. The holding circuits are associated with the columns and capable of holding first information indicating whether associated one of the columns is a verify-failed column or not. The logical gate chain includes a plurality of first logical gates associated with the columns and connected in series. Each of the first logical gates outputs a logical level to a next-stage first logical gate in a series connection. The logical level indicates whether the verify-failed column exists or not based on the first information in associated one of the holding circuit. The content indicated by the logical level output from each of the first logical gates is inverted using one of the first logical gates associated with the verify-failed column as a border.

First Embodiment

A semiconductor memory device according to a first embodiment will be described below giving a NAND flash memory as an example.

<Configuration of NAND Flash Memory>

FIG. 1 is a block diagram showing the configuration of a flash memory according to this first embodiment. As shown in FIG. 1, a NAND flash memory 1 includes a memory cell array 10, sense amplifiers 20-0 to 20-$m$, a holding unit 30, a reset unit 40, a fail-search chain 50 and a reset instruction unit 60. Hereinafter, each of the foregoing components and units will be explained.

<Memory Cell Array 10>

The memory cell array 10 includes a plurality of memory cell transistors capable of holding data. FIG. 2 is a circuit diagram of the memory cell array 10. As seen from FIG. 2, the memory cell array 10 includes a plurality of NAND cells 11. For example, each of NAND cells 11 includes 32 memory cell transistors MT (MT0 to MT31), selection transistors ST1 and ST2. A memory cell transistor MT has a stacked gate structure including a charge accumulation layer (e.g., floating gate) and a control gate. Specifically, the charge accumulation layer is formed on a semiconductor substrate with a gate insulating film interposed therebetween. The control gate is formed on the charge accumulation layer with an inter-gate insulating film interposed therebetween. The number of memory cell transistors MT is not limited to 32; for example, 8, 16, 64, 128 and 256 memory cell transistors MT may be used. Namely, the number of memory cell transistors MT is not limited. Moreover, the charge accumulation layer may be formed of an insulating material. Memory cell transistors adjacent to each other use source and drain in common. These memory cell transistors are arranged so that current paths are connected in series between selection transistors ST1 and ST2. A drain on the side of one terminal of a series-connected memory cell transistor is connected to the source of selection transistor ST1, while a source on the side of the other terminal thereof is connected to the drain of selection transistor ST2.

Control gates of memory cell transistors MT existing in the same row are connected in common to any of word lines WL (WL0 to WL 31). Gates of selection transistors ST1 and ST2 existing in the same row are connected in common to selection gate lines SGD and SGS, respectively. The drain of selection transistor ST1 is connected to any of bit lines BL (BL0 to BLm (m is a natural number more than 2)). The sources of selection transistors ST2 are connected in common to a source line SL.

A plurality of NAND cells 11 connected to the same word lines WL, selection gate lines SGD and SGS form a unit, which is called as one block. Data is erased all together in memory cell transistors MT in the same block. Further, data is written simultaneously in a plurality of memory cell transistors MT connected to the same word line WL, and this unit is call as a page.

As seen from FIG. 1, neighboring eight bit lines BL in the order from the bit line BL0 form one unit, which is called as a column. According to this embodiment, (n+1) columns C0 to Cn are provided ((n+1) is a natural number more than 1). Namely, bit lines BL8$i$ to BL (8$i$+7) belong to a column Ci (i is integer numbers from 0 to n).

<Sense Amplifier 20>

Sense amplifiers 20-0 to 20-$m$ will be explained below. As shown in FIG. 1, each of sense amplifiers 20-$j$ (j is integer numbers from 0 to m) is provided correspondingly to the bit line BLj. In a data read operation, the sense amplifier 20-$j$ senses and amplifies data read to the bit line BLj, and then, temporarily holds the data. In a data write operation, the sense amplifier 20-$j$ temporarily holds program data, and then, transfers the data to the bit line BLj. Moreover, in a verification operation, the sense amplifier 20-$j$ temporarily holds information (pass/failure information) whether or not data of each bit line BLj passes verification, and then, transfers the information to the holding unit 30. Hereinafter, the event that the data does not pass the foregoing verification is called as a failure or verify-failure, and column with the failure or verify-failure is called as failed column or verify-failed column.

<Holding Unit 30>

The holding unit 30 will be explained below. The holding unit 30 includes OR gates 31-0 to 31-$n$, MOS transistors 32-0 to 32-$n$ and fail-registers 33-0 to 33-$n$. An OR gate 31-$i$ is provided correspondingly to the column Ci. The OR gate 31-$i$ executes a logical sum operation of the pass/failure information output from the sense amplifiers 20 corresponding to the column Ci. A MOS transistor 32-$i$ is provided correspondingly to the column Ci. The MOS transistor 32-$i$ transfers the operation result of the OR gate 31-$i$ corresponding to the column Ci to a fail-register 33-$i$. A gate of MOS transistor 32-$i$ is supplied in common with a signal TSET. The fail-register 33-$i$ is provided correspondingly to the column Ci. The fail-register 33-$i$ holds the operation result of the OR gate 31-$i$, and then, outputs a signal FI<i> based on the foregoing operation result.

For example, the sense amplifier 20 outputs a level "L" (low) when the corresponding bit line BL passes the verification while outputs a level "H" (high) when it fails. Therefore, in each OR gate 31, if one bit having fail exists in the corresponding column Ci, the operation result is defined as a level "H." The fail-register 33 holds the foregoing operation result. Then, if the operation result of the corresponding OR gate 31 is a level "H", the fail-register 33 set a signal FI to a level "H." Conversely, if the foregoing operation result is a level "L," the fail-register 33 sets the signal FI to a level "L." When the fail-register 33 is reset by the reset unit 40, it sets the signal FI to a level "L." Therefore, the signal FI is defined as pass/failure information showing the existence of fail in the corresponding column.

<Fail-Search Chain 50>

The fail-search chain 50 includes logical gates 51-0 to 51-$n$ and an inverter 52. A logical gate 51-$i$ is provided correspondingly to the column Ci. Logical gates 51-0 to 51-$n$ are successively connected in series. For example, the logical gate 51 may be an AND gate.

The logical gate 51-0, in a first-stage of the series-connection, executes a logical product operation of a signal STRT supplied from a controller (not shown) and an inverted signal of a signal FI<0> output from the corresponding fail-register 33-0. Then, the logical gate 51-0 outputs the result of the foregoing logic product operation as a signal PoF<0>. Logical gates 51-$i$ after the second stage execute a logical product operation of a signal PoF<i-1> output from a pre-stage logical gate 51-($i$-1) and a signal FI<i> output from the corresponding fail-register 33-$i$. Then, these logical gates 51-$i$ output the result of the foregoing logic product operation as a signal PoF<i>. The inverter 52 inverts a signal output from the logical gate 51-$n$ in the final-stage, and then, outputs the inverted result as a signal FLAG.

<Reset Instruction Unit 60>

The reset instruction unit 60 includes logical gates 61-0 to 61-$n$. A logical gate 61-$i$ is provided correspondingly to the column Ci. For example, a logical gate 61 may be an AND gate.

The logical gate 61-0 executes a logical product operation of a signal STRT and a signal FI<0> output from the corresponding fail-register 33-0, and then, outputs the operation result as a signal PFB<0>. Logical gates 61-$i$ after the logical gate 61-1 execute a logical product operation of a signal PoF<i-1> output from a pre-stage logical gate 51-($i$-1) of the corresponding logical gate 51-$i$. Then, these logical gates 51-$i$ output the operation result as a signal PFB<i>.

<Reset Unit 40>

The reset unit 40 includes AND gates 41-0 to 41-$n$ and OR gates 42-0 to 42-$n$. An AND gate 41-$i$ and an OR gate 42-$i$ are provided correspondingly to the column Ci.

The OR gate 42-$i$ executes a logical sum operation of a signal COLA supplied from a controller and a signal PFB<i> output from the corresponding logical gate 61-$i$. The AND gate 41-$i$ executes a logical product operation of a signal TRST supplied from a controller and the corresponding OR gate 42-$i$, and then, outputs the operation result as a signal RRST<i>. The signal RRST<i> is a signal for resetting information held by the fail-register 33-$i$.

<Write Operation of NAND Flash Memory>

A data write operation executed by the NAND flash memory 1 according to this embodiment will be explained below.

<Program Sequence>

First, the flow of the data write operation will be roughly explained below with reference to FIG. 3. FIG. 3 is a timing chart showing a program sequence of a NAND flash memory 1.

As seen from FIG. 3, when a program command is issued externally, the NAND flash memory starts a program sequence and therefore becomes a busy state. First, a program operation is carried out, and thereby, a first-time data program is executed to memory cell transistors MT at a unit of a page. Thereafter, a verification operation is carried out. In the verification operation, data programmed in the memory cell transistors MT is internally read. Then, the sense amplifier 20 stores information (pass/failure information) as to whether a program is sufficiently executed.

When the verification operation completed, a detection operation is carried out. In the detection operation, the foregoing pass/failure information stored in the sense amplifier 20 is read to the fail-register 33. Then, detection is made whether or not a failed bit exists. The foregoing three operations, that is program, verify and detection will be hereinafter called as a program period.

A pass/failure signal is generated as the result of the detection operation. If there exists a column C having a failed bit, signal "Fail" is output; conversely, if the foregoing column C does not exist, signal "Pass" is output. The NAND flash memory 1 executes a second-time program period if the pass/failure signal is "Fail"; conversely, if the foregoing signal is "Pass," the NAND flash memory 1 quits the program sequence, and then, returns to a ready state.

Advance in mass capacity and scale reduction is continuous; therefore, if a sufficient program is carried out to all memory cell transistors, the following problem arises. Namely, the number of times of repeating a program period becomes huge; for this reason, time to execute a program sequence increases. In order to solve the foregoing problem, the NAND flash memory 1 according to this embodiment employs a pseudo-pass function. According to the pseudo-pass function, when a bit error is less than a predetermined allowable number, the memory 1 ends the program sequence even if write is in an incomplete state. In this way, a high-speed programming is achieved.

The following circuit technique is required as means for realizing the pseudo-pass function. Namely, the verification operation is carried out; as a result, the number of bits of a memory cell transistor, which is determined as a fail must be counted. The fail-search chain 50, reset instruction unit 50 and reset unit 40 shown in FIG. 1 are provided as a circuit for realizing the pseudo-pass function.

<Details of Program Sequence>

Figure 4:
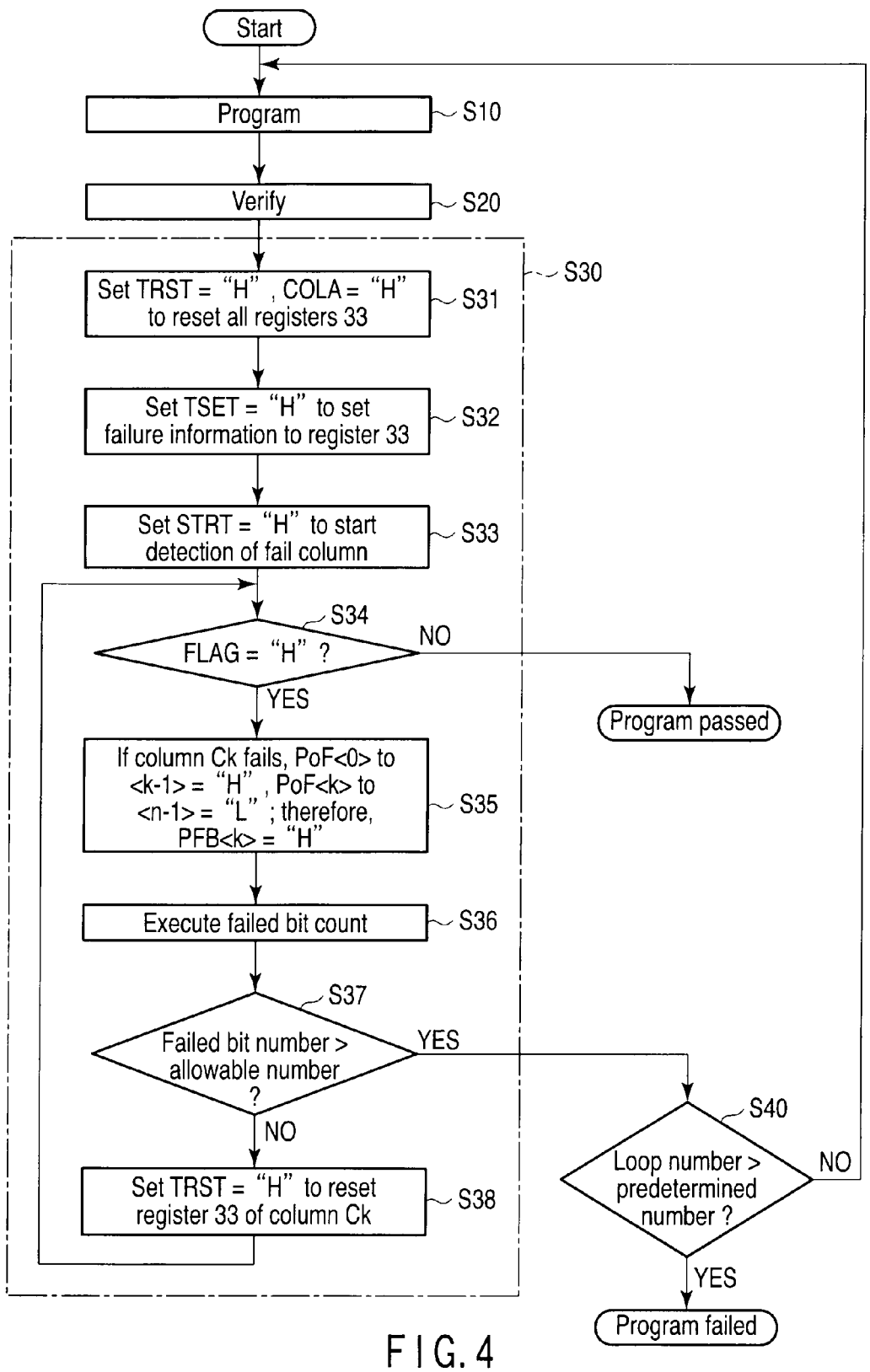
FIG. 4 is a flowchart to explain a write operation according to a first embodiment.

The details of the program sequence will be explained below with reference to FIG. 4. FIG. 4 is a flowchart to explain a data write operation by the NAND flash memory 1. In particular, the flowchart of FIG. 4 has attracted attention to a process for realizing the pseudo-pass function.

(Step S10)

A program operation is carried out in the first step S10. The program operation is executable by a known method.

(Step S20)

A verification operation is carried out in the second step S20. The verification operation is executable by a known method. Data read is internally carried out to a memory cell transistor executing a program. A sense amplifier 20 provided correspondingly to each bit stores the verification result.

(Step S30)

Thereafter, a detection operation is carried out in the third step S30. According to the detection operation, the verification result is transferred from the sense amplifier 20 to the fail-register 33 to count the number of failed bits. Then, a comparison with a predetermined bit error allowable number NF is made. The detection operation is carried out in the following manner.

First, the fail-register 33 is reset (step S31). Specifically, for example, a controller sets signals TRST and COLA to a level "H." As a result, all of signals RRST are asserted (set to level "H"), and all of fail registers 33 are reset. As described above, the fail-register 33 sets a signal FI to a level "L" (i.e., logical level showing non-existence of failure) in a reset state. Thereafter, a controller sets both of signals TRST and COLA to a level "L."

Pass/failure information is set to the fail-register 33 (step S32). Specifically, for example, a controller sets a signal TSET to a level "H" to turn on a MOS transistor 32. As a result, the operation results of OR gates 31-0 to 31-$n$ are set to fail-registers 33-0 to 33-$n$, respectively. Namely, one failed bit exists in a column C, a level "H" is set to the corresponding fail-register 33. A signal FI output from the fail-register 33, which is set to a level "H," gets a level "H" (i.e., logical level showing existence of failure).

Next, for example, a controller sets a signal STRT to a level "H," and thereby, search of a failed column is started (step S33). The existence of failure is determined according to a signal FLAG. Namely, if failure dose not exist in all of columns C0 to Cn, the signal FLAG gets a level "L" (NO in step S34), and thus, a program is passed. Therefore, the program sequence ends.

Conversely, if failure exists in at least any of columns C0 to Cn, the signal FLAG gets a level "H" (YES in step S34). In this case, if failure exists in a column Ck (k is a variable taking any of 0 to n), signals PoF<0> to PoF<k−1> are set to a level "H," signals PoF<k> to PoF<n−1> are set to a level "L," and further, a signal PFB<k>="H." However, the column Ck has the smallest suffix i of the failed column Ci (the case where fail exists in a plurality of columns). In other words, the column Ck has the smallest column address of the failed columns C. In still other words, of the failed column C, the column Ck corresponds to a logical gate 51 nearest to the input side in the serial connection of logical gates 51. As described above, when a signal PoF changes, at column Ck, from a level "H" to a level "L," and/or a signal PFB<k> is a level "H," a controller recognizes that failure exists in at least column Ck.

The controller executes failed-bit count (step S36). This step is carried out by a detection circuit omitted in FIG. 1, for example. The detection circuit searches each bit of the column Ck specified in step S35 to count the number of failed bits. Then, the detection circuit accumulates the counted number of failed bits in a register. This step is also executable by a known method.

The controller determines the number of failures (step S37). In step S37, the controller determines whether or not the accumulated number of failed bits stored in the register exceeds a predetermined bit error allowable number NF. If the accumulated number exceeds the allowable number NF (YES in step S37), the controller executes the following procedure. Namely, if the number of times of repeating a program period (loop number) is within a preset value (NO in step S40), the flow returns to step S10, and then, transfers to a program period. Conversely, if the foregoing number exceeds the preset value (YES in step S40), the program fails. Therefore, the program sequence ends.

In step S37, if the accumulated number of failed bits does not exceed a predetermined bit error allowable number NF (NO in step S37), the controller resets a fail-register (step S38). Specifically, the controller sets a signal TRST to a level "H." A signal COLA remains a level "L." In this way, a signal RRST<k> corresponding to the column Ck in which failed bit count is executed in step S36 is set to a level "H"; therefore, the fail-register 33-$k$ is reset. Other fail-registers 33 are not reset. Then, the flow returns to step S34.

As described above, according to the detection operation, the detection circuit specifies any one failed column Ck if a signal FLAG is a level "H," and then, counts the number of failed bits in the failed column Ck. Further, the circuit executes the foregoing operation with respect to all failed columns C. If the accumulated value of the number of failed bits does not exceed a preset value, the circuit passes a program.

<Example of Detection Operation>

Figure 6:
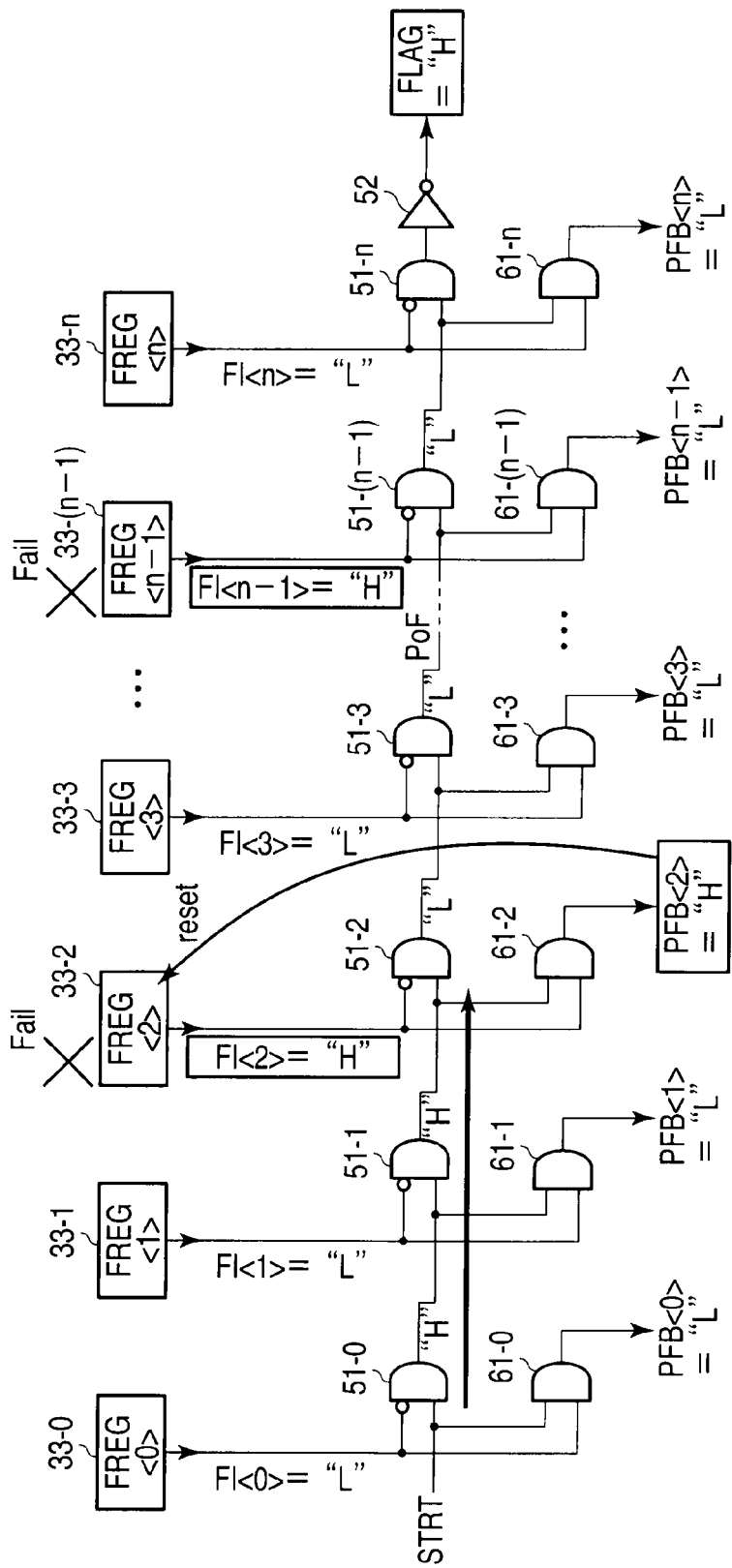
Figure 7:
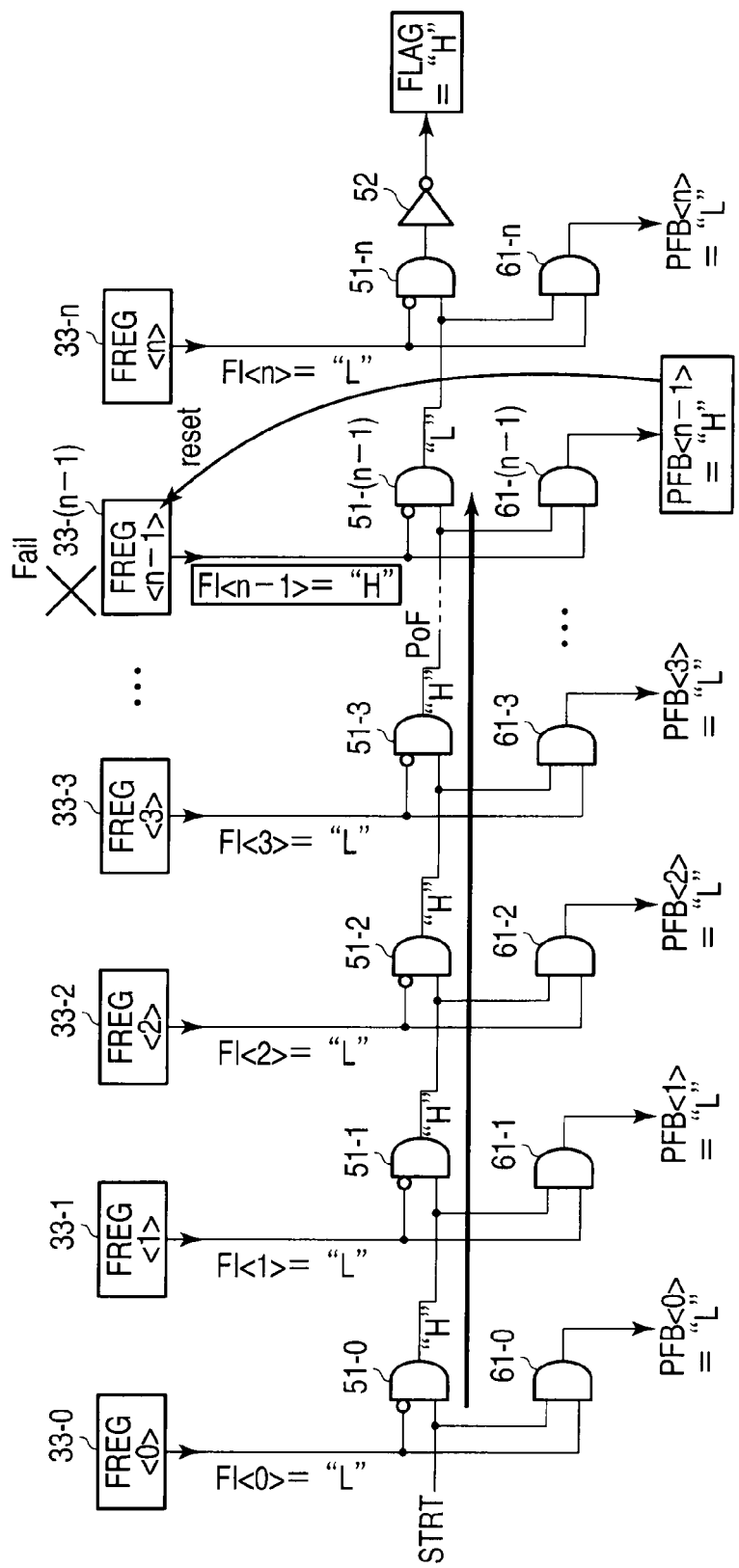

Each operation of the holding unit 30, the fail-search chain 50 and the reset instruction unit 60 in the detection operation will be detailedly explained below with reference to FIG. 5 to FIG. 7. FIG. 5, FIG. 6 and FIG. 7 are circuit diagrams showing the holding unit 30, the fail-search chain 50 and the reset instruction unit 60, respectively. In FIG. 5 to FIG. 7, portions only necessary to this explanation are shown in particular.

(Case where No Failed Column Exists)

First, the case where no failed column exists will be explained below with reference to FIG. 5. If no failure exists, signals FI are all a level "L." In this state, when a signal STRT changes from a level "L" to a level "H," failure search is started. First, the operation result of the logical gate 51-0 is set to a level "H," and based on this result; the operation result of the logical gate 51-1 is set to a level "H." Further, based on the foregoing result, the operation result of the logical gate 51-2 is set to a level "H," and likewise, the operation result of the logical gate 51-*n* is set to a level "H." In other words, the level "H" input as a signal STRT is successively transferred from the logical gate 51-0 to the logical gate 51-*n*. As a result, a signal FLAG is set to a level "L" (NO in step S34 of FIG. 4); therefore, the controller recognizes that no failed column exists.

(Case where Failed Column Exists)

The case where failed column exists will be explained below with reference to FIG. 6 and FIG. 7. For example, the case where columns C2 and C (n−1) are failed is shown.

As seen from FIG. 6, "Fail" is stored in fail-registers 33-2 and 33-(*n*−1); therefore, signals FI<2> and FI<n−1> are set to a level "H." In this state, when a signal STRT changes from a level "L" to a level "H", failure search is started. Then, signals PoF<0> and PoF<1> are both set to a level "H"; however, the signal FI<2> is set to a level "H." Therefore, signals PoF<2> to PoF<n−1> are set to a level "L." As a result, a signal FLAG is set to a level "H" (YES in step S34 of FIG. 4), and thus, the controller recognizes that failure exists in any column.

In this case, in signals PoF, signals by PoF<1> are set to a level "H"; on the other hand, signals after PoF<2> are set to a level "L." Namely, the logical level of the signal PoF changes using the fail-register 33-2 corresponding to the failed column C2 as the border. A signal PFB (Pass Fail Border) logically shows the border of the signal PoF. The signal PFB is the operation result of the logical product of a signal FI ad a signal PoF. The signal FI<2> and the signal PoF<1> of the third fail-register 33-2 are both set to a level "H"; therefore, the signal PFB<2> is set to a level "H" (step S35 of FIG. 4, j=2). Conversely, signals FI<0> and FI<1> are set to a level "L"; therefore, signals PFB<0> and PFB<1> is set to a level "L." Moreover, signals PoF<2> to PoF<n−1> are set to a level "L"; therefore, signals PFB<3> to PFB<n> is set to a level "L." The controller recognizes that failure exists in the third column C2 because the signal PFB<2> is a level "H", and thus, executes failed-bit count with respect to the column C2 (step S36).

After the failed-bit count, the controller resets the fail-register 33-2 (step S38). Specifically, the controller sets a signal TRST to a level "H." The signal PFB<2> is a level "H"; therefore, the signal RRST<2> only is set to a level "H." In this way, the fail-register 33-2 only is reset. Other signals RRST<0>, RRST<1>, RRST<3> to RRST<n> keep a level "L" because signals PFB<0>, PFB<1>, PFB<3> to PFB<n> are a level "L." Therefore, fail-registers 33-0, 33-1, 33-3 to 33-*n* are not reset.

FIG. 7 shows a state after the operation of FIG. 6. The fail-register 33-2 is reset, and thereafter, failure remains in the fail-register 33-(*n*−1); therefore, a signal FLAG keeps a level "H" (YES in step S34). However, signals PoF<0> to PoF (n−2) are set to a level "H", and the signal PFB<n−1> is set to a level "H." Therefore, the controller executes failed-bit count with respect to the column C (n−1), and continuously resets the fail-register 33-(*n*−1) using the signal PFB<n−1>.

The foregoing operation is carried out; as a result, failure dose not exist in all fail-registers 33. In other words, the same state as FIG. 5 is provided; therefore, a signal FLAG is set to a level "L" (NO in step S34).

(Operation Timing in Case where Failed Column Exists)

An operation timing in the case where failed column exists in the columns C2 and C (n−1) will be explained below with reference to FIG. 8. FIG. 8 is a time chart showing signals COLA, TRST, TSET, STRT, FI<0> to FI<3>, FI<n−1>, FI<n>, PoF<0> to PoF<3>, PoF<n−1>, FLAG, PFB<0> to PFB<3>, PFB<n−1> and PFB<n>.

Time t1

First, the controller sets a signal COLA (column collective selection signal) and a signal TRST (fail-register reset signal) to a level "H" to reset outputs (signals FI<0> to FI<n>) of all fail-registers 33. As a result, an output of each stage of the fail-search chain 50, that is, signals PoF are all set to a level "H."

Time t3

At time t3, the controller sets a signal TSET (fail-register set signal) to a level "H." As a result, failure information is stored in fail-registers 33 from each sense amplifier 20. In this case, the signal FI<2> corresponding to the column C2 and the signal FI<n−1> corresponding to the column C(n−1) are set to a level "H".

Time t5

At time t5, the controller sets a signal STRT (failure search start signal) to a level "H" to start failure search. When the signal STRT is set to a level "H", a signal PoF successively propagates each stage of the fail-search chain 50. Therefore, the signal PoF is set to a level "L" in the first column (column C2 in this embodiment) having failure information (FI) of a level "H". Thus, signals PoF after that all changes to a level "L." As a result, a signal FLAG is set to a level "L."

The signal PoF<2> of the column C2 is set to a level "L", and thereby, the signal PFB<2> is set to a level "H". Therefore, the controller starts failed-bit count with respect to the column C2. According to the failed-bit count, the controller searches each bit belonging to the column C2, and then, counts the number of failed bits, and thereafter, accumulates the number of failed-bits in a register. Then, the controller compares the accumulated number of failed bits with a failed bit allowable number NF, and proceeds to the next step if the accumulated number of failed bits does not exceed the number NF.

Time t7

When failed-bit count with respect to the column C2 ends, at time t7, the controller sets a signal TRST to a level "H" to reset the fail-register 33-2 (FI<2>) of a column having a signal PFB of a level "H" (column C2 in this embodiment). The signal FI<2> is reset, and thereby, the signal PoF<2> is returned to a level "L", and in this way, propagation of the fail-search chain 50 is restarted.

Time t9

After propagation restart, the signal PoF<n−1> of the column C (n−1) keeps a level "L" because the signal FI<n−1> is a level "H". Therefore, the signal PFB<n−1> is set to a level "H", and thereby, failed-bit count with respect to the column C (n−1) is started.

Time t11

When the failed-bit count with respect to the column C (n−1) ends, at time t11, the controller sets a signal TRST to a level "H" to reset the fail-register 33-(*n*−1) (FI<n−1>). The signal FI<n−1> is reset, and thereby, the signal PoF<n−1> returns to a level "L"; therefore, propagation of the fail-search chain 50 is restarted.

Time t12

The fail-register 33-2 is reset at time t11; as a result, in the fail-search chain 50, the signal PoF of a level "H" propagates by the final-stage logical gate 51-*n*; therefore, a signal FLAG gets a level "L". As a result, failure search with respect to all columns ends.

Effect of this Embodiment

As can be seen from the above description, a semiconductor memory device according to this embodiment can improve a data write speed. The effect will be explained below.

The demands of a semiconductor memory such as a NAND flash memory rapidly increases for the purpose of handling mass-capacity data such as an image and a moving picture. With the mass capacity of a memory area, the scale reduction of a memory cell advances; for this reason, its yield and reliability have come to be seen as a problem. In order to solve the foregoing problem, the ECC technique has been widely used as a technique of compensating for an error generated at a certain probability in a write operation to a memory cell and a read operation from there.

Moreover, in a memory chip, a verification operation is carried out in order to confirm whether or not write to a memory cell is correctly performed. For example, write is again carried out with respect to a memory cell such that write is insufficient. In this case, a pseudo-pass function is employed to improve a write speed.

As described in the background technique, a circuit technique using a binary search has been known as a technique of realizing a pseudo-pass function. The technique using a binary search is roughly as follows.

First, fail-registers provided for each column are divided into two groups, and then, fail-registers belonging to any one of the two groups are selected to read pass/failure information. If failure exists in the selected fail-registers belonging to the group, the group is further divided into two groups. Then, fail-registers belonging to any one of the two groups are selected to read pass/failure information. If failure exists in fail-registers belonging to a non-selected group, the same processing as above is carried out with respect to the group. The foregoing processing is repeated until the number of columns include in one group becomes one, and thereby, a failed column is specified.

However, according to the above processing, much time is taken to specify a failed column. Moreover, a column address is used to select a fail-register. In other words, it is impossible to further receive another column address in a detection operation. Therefore, in order to accept the column address externally using a cache read operation in the detection operation, the detection operation is suspended or stopped and started again from the beginning.

However, according to the configuration according this embodiment, the fail-search chain 50 is provided in order to determine the existence of a failed column (i.e., signal FLAG="H"/"L"). Further, the reset instruction is provided in order to specify a failed column (i.e., signal PFB="H").

The fail-search chain 50 includes logical gates connected in series. Further, the fail-search chain 50 is configured so that the logical level of the signal PoF successively propagating logical gates 51 is inverted after and before the failed column. Moreover, the reset instruction unit 60 includes a set of logical gates 61 corresponding to each column. Further, the reset instruction unit 60 is configured to set a signal PFB to a specified logical level (level "H" in this embodiment) on the position where the logical level of the signal PoF is inverted.

Therefore, according to the above configuration, when a signal TRST is asserted to start a detection operation, it is possible to immediately a column having the first failure. Then, when failed-bit count with respect to the specified column is carried out to reset the corresponding fail-register, it is possible to immediately specify the next column having failure. This serves to achieve a high speed of the detection operation.

In addition, a column is specified by propagation of a signal PoF in a detection operation; therefore, a column address is not required. As a result, during the detection operation, it is possible to accept another column address externally; therefore, cache read is possible.

Second Embodiment

A semiconductor memory device according to a second embodiment will be described below. According to this second embodiment, the logical gate 51 of the fail-search chain 50 described in the first embodiment is modified. Other configuration is the same as the first embodiment; therefore, points different from the first embodiment will be hereinafter explained.

<Configuration>

Figure 9:
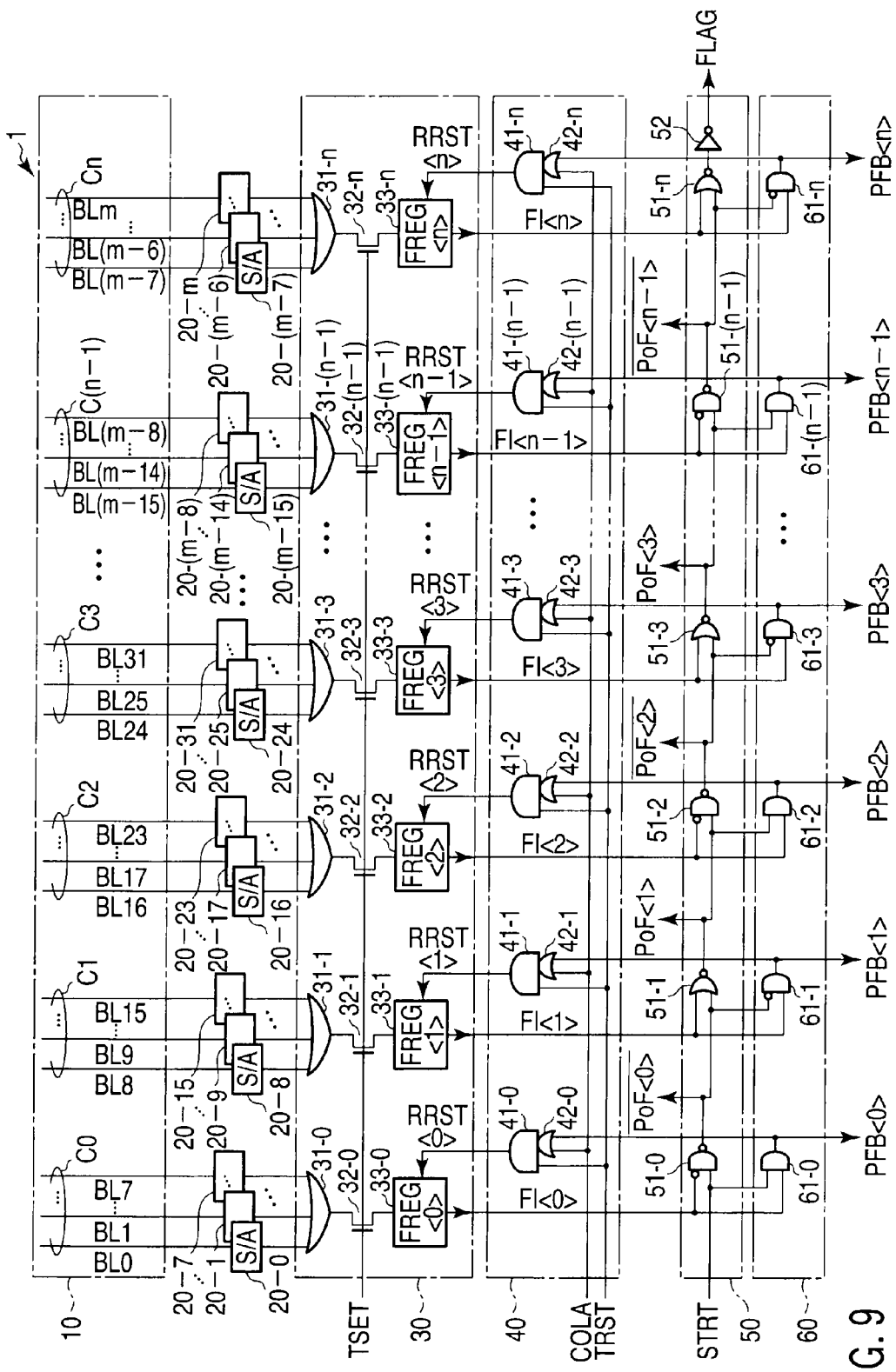
FIGS. 9, 10, 11, and 12 are block diagrams showing the configuration of a flash memory according to a second embodiment.

FIG. 9 is a block diagram showing the configuration of a NAND flash memory 1 according to the second embodiment. The following changes are added to the fail-search chain 50 shown in FIG. 1 described in the first embodiment. Specifically, the change includes the following points:

Even-stage logical gates 51-0, 51-2, 51-4, ... 51-($n-1$) are replaced with a NAND gate;

The operation result of the above NAND gate is defined as an inverted signal /PoF of a signal PoF; and Odd-stage logical gates 51-1, 51-3, 51-5, ... 51-$n$ are replaced with a NOR gate.

In this embodiment, a reset instruction unit 60 has no change. In FIG. 9, a circle mark showing signal inversion is added to one input terminal of each of logical gates 61-1, 61-3, ... 61-$n$ corresponding to odd-stage columns. This is because a signal supplied from the pre-stage column is an inverted signal /PoF of a signal PoF. The operation of the reset instruction unit 60 is the same as the first embodiment.

<Operation>

Figure 10:
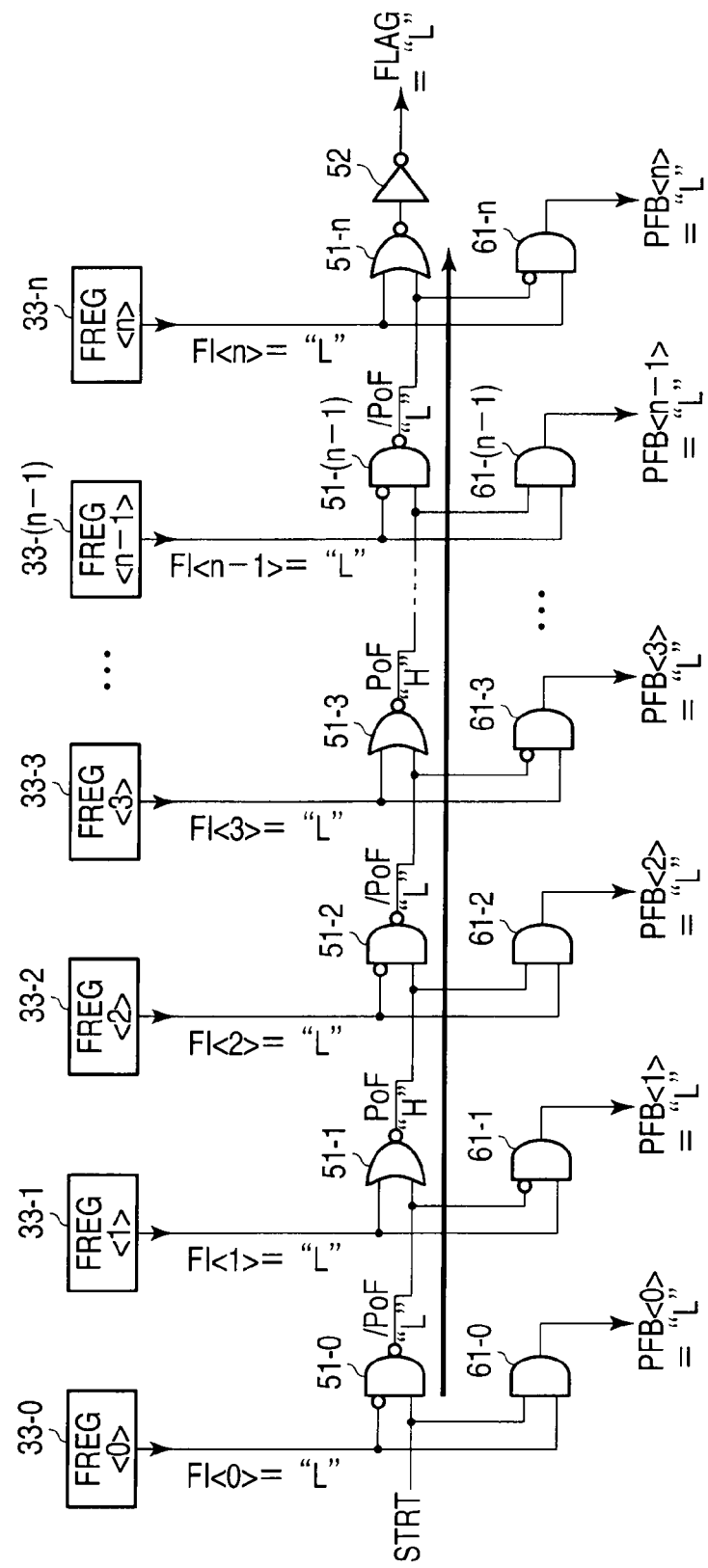
Figure 11:
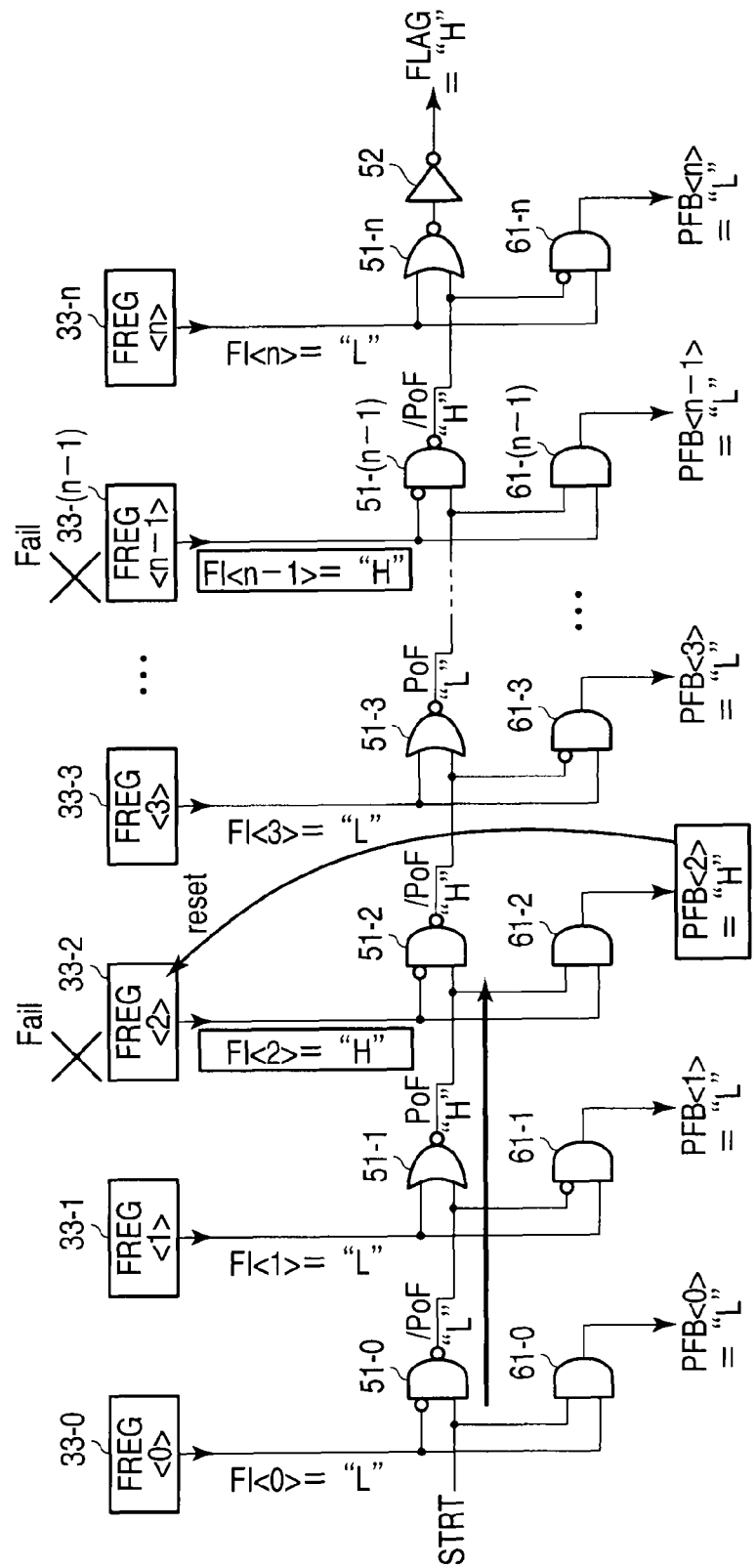
Figure 12:
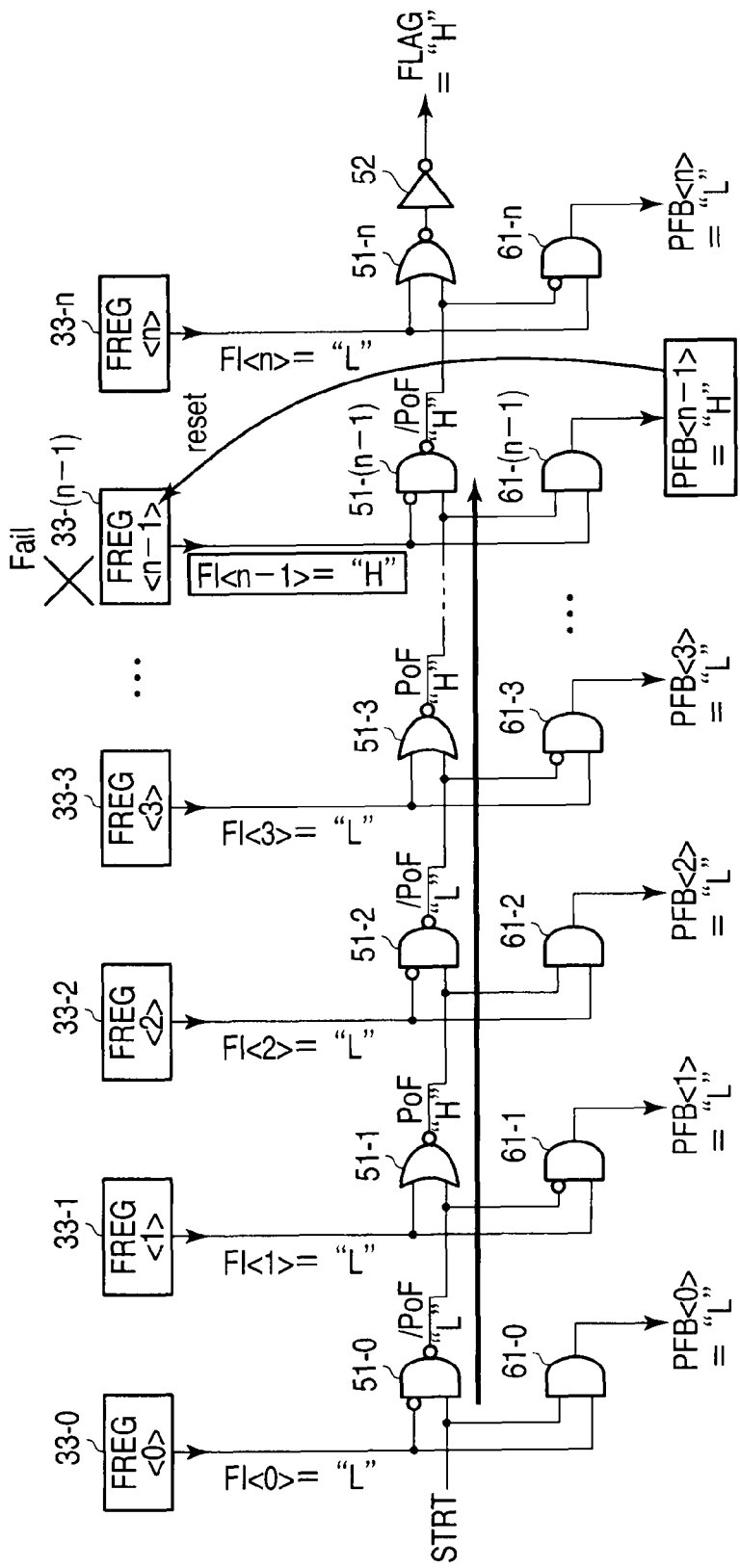

A program sequence according to this second embodiment is the same as FIG. 3 and FIG. 4 described in the first embodiment. Hereinafter, each operation of a holding unit 30, a fail-search chain 50 and a reset instruction unit 60 in a detection operation will be explained with reference to FIG. 10 to FIG. 12. FIGS. 10, 11 and 12 are circuit diagrams showing the holding unit 30, fail-search chain 50 and reset instruction unit 60, respectively. In FIG. 10 to FIG. 12, portions only necessary to explain this explanation are shown.

(Case where No Failed Column Exists)

The case where no failed column exists will be explained below with reference to FIG. 10. If no failed column exists, all of signals PoF<0> to PoF<n-1> are set to a level "H". Specifically, even-stage logical gates (NAND gates) 51 each output a signal /PoF="L" while odd-stage logical gates (NOR gates) 51 each output a signal PoF="H". As a result, a signal FLAG is set to a level "L". Naturally, signals PFB<0> to PFB<n> are all a level "L".

(Case where Failed Column Exists)

The case where failed column exists will be explained below with reference to FIG. 11 and FIG. 12. For example, the case where the columns C2 and C (n-1) are failed, same as case shown in FIG. 6 and FIG. 7, is described 7.

As shown in FIG. 11, signals FI<2> and FI<n-1> are at a level "H." Therefore, the signal PoF<0> is set to a level "L" while the signal PoF<1> is set to a level "H." Namely, in the fail-search chain 50, a signal PoF with a level "H" propagates by logical gates 51-2. However, the signal FI<2> is set to a level "H"; therefore, an output /PoF<2> of the logical gate 51-2 is set to a level "H." That is, PoF<2>="L." Further, outputs of logical gates 51-3 to 51-(n−1) are set such that signals PoF<3> to PoF<n−1> are set to a level "L."

Moreover, the signal PoF<1>="H"; therefore, the signal PFB<2> is set to a level "H," and after failed-bit count, the fail-register 33-2 is reset.

FIG. 12 shows the subsequent state. As shown in FIG. 12, outputs of logical gates 51-0 to 51-(n−1) has a logical level such that signals PoF<0> to PoF<n−1> are set to a level "H." Namely, the signal PoF with a level "H" propagates by the logical gate 51-(n−1). However, the signal FI<n−1> is a level "H"; therefore, an output /PoF<n−1> of the logical gate 51-(n−1) is set to a level "H." That is, PoF<n−1> is set to a level "L." Therefore, failed-bit count is carried out with respect to the column C (n−1), and then, the fail-register 33-(n−1) is reset using a signal PFB<n−1>.

As a result of above operation, there is no existence of failure in all of fail-registers 33. In other words, the same state as FIG. 10 is obtained; therefore, a signal FLAG is set to a level "L."

Effect of this Embodiment

According to the configuration according to this embodiment, the same effect as the first embodiment, and in addition, the circuit area of the NAND flash memory 1 is reduced.

Usually, in order to implement an AND gate using a CMOS technique, a two-stage configuration, including a NAND gate and an inverter, is required. Therefore, if the fail-search chain 50 is configured using an AND gate, the critical pass is configured by logical gates having the number of stages twice as much as the number of necessary columns.

However, according to the configuration of the second embodiment, the logical gate 51 of the fail-search chain 50 is implemented using an NAND gate and a NOR gate. Therefore, a chain unit of each column is configurable using one-stage logical gate. In other words, the chain unit is configurable using the same number of logical gates as the number of necessary columns. As a result, it is possible to shorten time taken to specify a failed column, and further, to reduce current consumption and peak current in an operation.

As described above, semiconductor memory devices according to the first and second embodiments include a memory cells MT, holding circuits (i.e., fail-registers 33-0 to 33-n) and a logical gate chain (i.e., fail-search chain 50). The memory cells are associated with columns C, and are capable of holding data. Each of holding circuits 33-1 to 33-n is associated with one of the columns C, and is able to hold first information (i.e., signals FI<0> to FI<n>) indicating whether associated one of the columns C is verify-failed column or not. The logical gate chain 50 includes a plurality of first logical gates 51-0 to 51-n. These first logical gates are connected in series to output a logical level PoF<0> to PoF<n−1> (or /PoF) indicating whether the verify-failed column exists or not to the next stage. Further, the content indicated by the logical level PoF (or /PoF) output from each of the first logical gates 51-0 to 51-n is inverted using one of the first logical gates associated with the verify-failed column (for example, column C2 in FIG. 6 or column C (n−1) in FIG. 7) as a border.

Each of first logical gates 51-i executes a logical operation of first information FI<i> in associated one of the holding circuit 33 and an output of a pre-stage first logical gate 51-(i−1) in the series connection. If a logical level PoF<i−1> of the pre-stage first logical gate 51-(i−1) indicates that verify-failed column does not exists, the first logical gate 51-i determines a logical level PoF<i> based on the first information FI<i>. Conversely, if the logical level PoF<i−1> output from the pre-stage first logical gate 51-(i−1) indicates that the verify-failed column exists, the first logical gate 51-i outputs a logical level PoF<i> indicating that verify-failed column exists regardless of the first information FI<i>.

Moreover, semiconductor memory devices according to the first and second embodiments include a memory cells MT, first and second holding circuits (fail-registers 33-0 and 33-1), and first and second logical gates 51-0, 51-1. The first holding circuit 33-0 is associated with a first column C0, and is able to hold first information FI<0> indicating whether the first column C0 is a verify-failed column or not. The second holding circuit 33-0 is associated with a first column C1, and is able to hold second information FI<1> indicating whether the second column C1 is the verify-failed column or not. The first logical gate 51-0 outputs a first signal PoF<0> (or /PoF<0>) indicating whether the verify-failed column exists or not in accordance with the first information FI<0>. The second logical gate 51-1 outputs a second signal PoF<1> (or /PoF<0>) indicating whether the verify-failed column exists or not in accordance with the second information FI<1> and the first signal PoF<0>. If the first signal PoF<0> indicates that the verify-failed column exists (PoF<0>="L", or /PoF<0>="H"), the second logical gate 51-1 outputs the second signal PoF<1> (PoF<1>="L") indicating that the verify-failed column exists regardless of the second information FI<1>. Conversely, if the first signal PoF<0> indicates that the verify-failed column does not exists (PoF<0>="H", or /PoF<0>="L"), the second logical gate 51-1 outputs the second signal PoF<1> in accordance with the second information FI<1>.

According to the above configuration, data write speed is improved in a semiconductor memory device. The fail-search chain 50 is not limited to the circuit configuration described in the first and second embodiments. Namely, various configurations may be employed so long as a circuit block corresponding to each column is connected in series, and an output of the circuit block is inverted according to failure with the smallest column address. In this case, this term "inversion" does not simply mean a change from "H" to "L" or from "L" to "H", but the content (i.e., existence of failure) shown by the signal is inverted.

Further, according to the first and second embodiment, each memory transistor MT may be able to hold data having two bits or more. For example, First, write is carried out with respect to a lower bit, and then, write is carried out an upper bit (two-bit case), and thereafter, a detection operation (step S30) may be carried out with respect to each bit. Alternatively, the detection operation may be carried out only when the upper bit is written. Moreover, if failure is handled at a unit of byte, there is no need to execute failed-bit count (step S36) in FIG. 4; therefore, the number of failed columns may be compared with the column error allowable number in step S37.

Furthermore, according to the first and second embodiment, the detection operation in a data write operation is given as an example. The same operation as above is applicable to the case where data is erased. For example, data is erased, and thereafter, erase verification is carried out in order to confirm whether or not the threshold of a memory cell transistor MT sufficiently lowers. In addition, the following method has been known; namely, after an erase operation, write (called as weak program or soft program) is carried out to set the threshold of a memory cell transistor MT to a suitable range. The erase verification is carried out after the weak program or soft program, and then the detection operation recited in the first or second embodiments may be executed.

Furthermore, according to the first and second embodiment, a NAND flash memory is given as an example. For example, a semiconductor memory device of the first and second embodiments may be NOR, DINOR and AND flash memories. The embodiments are not limited to a flash memory. For example, the embodiments are applicable to various semiconductor memories such as a magneto-resistive random access memory (MRAM), which uses a magneto tunneling junction element as a memory cell and a resistance random access memory (ReRAM) using a variable resistance element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells associated with columns and capable of holding data;
   a plurality of holding circuits associated with the columns and capable of holding first information indicating whether associated one of the columns is a verify-failed column or not; and
   a logical gate chain which includes a plurality of first logical gates associated with the columns and connected in series, each of the first logical gates outputting a logical level to a next-stage first logical gate in a series connection, the logical level indicating whether the verify-failed column exists or not based on the first information in associated one of the holding circuit,
   wherein the content indicated by the logical level output from each of the first logical gates is inverted using one of the first logical gates associated with the verify-failed column as a border.

2. The device according to claim 1, wherein each of the first logical gates executes a logical operation of the first information in associated one of the holding circuits and an output from a pre-stage first logical gate in the series connection,
   if a logical level output from the pre-stage first logical gate indicates that the verify-failed column does not exists, the first logical gates determine the logical level based on the first information, and
   if the logical level output from the pre-stage first logical gate indicates that the verify-failed column exists, the first logical gates outputs the logical level indicating that the verify-failed column exists regardless of the first information.

3. The device according to claim 1, further comprising:
   a reset instruction unit configured to reset one of the holding circuits positioned on the border.

4. The device according to claim 3, wherein the reset instruction unit includes a plurality of second logical gates associated with the columns and output reset signal for resetting one of the holding circuits, and
   only one of the second logical gates, which is positioned on the border, outputs the reset signal based on the first information in the associated one of the holding circuits and an output from the pre-stage first logical gate of the associated one of the first logical gates.

5. The device according to claim 3, wherein the reset instruction unit successively resets the holding circuits to propagate the logical level indicating that the verify-failed column does not exists to a final-stage first logical gate.

6. The device according to claim 1, wherein the verification result with respect to the memory cells is determined based on an output from the first logical gates in the logical gate chain.

7. The device according to claim 1, wherein each of the columns includes a plurality of bits, and
   the device further comprises a detection circuit which detects a failed-bit number with respect to one of the columns associated one of the holding circuits which holds the first information indicating that the verify-failed column exists.

8. A semiconductor memory device comprising:
   a plurality of memory cells associated with a row and columns and capable of holding data;
   a first holding circuit associated with a first column and capable of holding first information indicating whether the first column is a verify-failed column or not;
   a second holding circuit associated with a second column and capable of holding second information indicating whether the second column is the verify-failed column or not;
   a first logical gate which outputs a first signal indicating whether the verify-failed column exists or not in accordance with the first information; and
   a second logical gate which outputs a second signal indicating whether the verify-failed column exists or not in accordance with the second information and the first signal,
   wherein if the first signal indicates that the verify-failed column exists, the second logical gate outputs the second signal indicating that the verify-failed column exists regardless of the second information, and
   if the first signal indicates that the verify-failed column does not exists, the second logical gate outputs the second signal in accordance with the second information.

9. The device according to claim 8, further comprising:
   a reset instruction unit which is capable of resetting the first and second holding circuits.

10. The device according to claim 9, wherein the reset instruction unit includes:
    a third logical gate which issues a first reset instruction to reset the first holding circuit based on the first information; and
    a fourth logical gate which issues a second reset instruction to reset the second holding circuit based on the first and second information,
    if the first signal indicates that the verify-failed column exists, the fourth logical gate does not issue the second reset instruction, and
    if the first signal indicates that the verify-failed column does not exist, the fourth logical gate issues the second reset instruction based on the second information.

11. The device according to claim 8, wherein the verification result with respect to the memory cells is determined based on outputs from the first and second logical gates.

12. The device according to claim 8, wherein each of the columns includes a plurality of bits, and
    the device further comprises a detection circuit which detects a failed-bit number with respect to one of the columns associated one of the first and second holding circuits which holds the first information or second information indicating that the verify-failed column exists.

13. A semiconductor memory device comprising:
    a memory cell array which includes a plurality of memory cells associated with columns; and a logical gate chain which includes a plurality of logical gates associated with the columns and connected in series, wherein if one of the columns is a verify-failed column, the logical gates positioned in a pre-stage of the verify-failed column output signals indicating non-existence of verify-failed column, and the logical gates positioned after the verify-failed column output signals indicating an existence of verify-failed column.

14. The device according to claim 13, wherein two or more columns are verify-failed column, the logical gates positioned in a first one stage of the logical gates corresponding to the verify-failed column and subsequent logical gates output a signal indicating an existence of verify-failed column.

15. The device according to claim 14, further comprising holding circuits associated with the columns, wherein the holing circuits hold information indicating whether the associated one of the columns is verify-failed column or not, and an output of each of the logical gates is based on an output from a pre-stage logical gate and the information in the associated one of the holding circuits.

16. The device according to claim 15, further comprising a reset instruction unit which resets one of the holding circuits holding the information indicating that the associated one of the columns is verify-failed column, wherein if two or more columns are the verify-failed column, the reset instruction unit resets one of the holding circuits corresponding to a logical gate positioned on a first one stage of the logical gates corresponding to the verify-failed columns.

17. The device according to claim 16, wherein the reset instruction unit repeats a reset operation of the holding circuits until any of the following condition (i) a final-stage logical gate in series connection outputs a signal indicating non-existence of verify-failed column, or (ii) the number of reset times reaches a predetermined value.

* * * * *